(12) United States Patent
Sutardja et al.

(10) Patent No.: US 7,724,596 B1
(45) Date of Patent: May 25, 2010

(54) AUTO-ZERO CURRENT SENSING AMPLIFIER

(75) Inventors: Pantas Sutardja, Los Gatos, CA (US); Yonghua Song, Cupertino, CA (US); Bo Wang, Sunnyvale, CA (US); Chih-Hsin Wang, San Jose, CA (US); Qiang Tang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 77 days.

(21) Appl. No.: 12/209,577

(22) Filed: Sep. 12, 2008

Related U.S. Application Data

(60) Provisional application No. 60/972,498, filed on Sep. 14, 2007.

(51) Int. Cl.
*G11C 7/02* (2006.01)
*H03F 3/45* (2006.01)
(52) U.S. Cl. .................. 365/208; 365/207; 327/51; 327/56
(58) Field of Classification Search .................. 365/208
See application file for complete search history.

(56) References Cited

U.S. PATENT DOCUMENTS 6,498,757 B2 * 12/2002 Kuo et al. .................. 365/207
6,525,978 B2 * 2/2003 Weber et al. ................ 365/207
2003/0081475 A1 5/2003 Weber et al.
2006/0092719 A1 * 5/2006 Fujita .................... 365/189.06

FOREIGN PATENT DOCUMENTS

EP 1 640 995 A1 3/2006
WO WO 02/45090 A2 6/2002

OTHER PUBLICATIONS

The International Search Report and Written Opinion of the International Searching Authority, or the Declaration mailed Dec. 29, 2008 for International Application No. PCT/US2008/076175 filed Sep. 12, 2008; 13 pages.

* cited by examiner

*Primary Examiner*—Son L Mai

(57) ABSTRACT

A sensing amplifier for a memory cell comprises a selection stage that outputs one of a reference current and a memory cell current during a first period and the other of the reference current and the memory cell current during a second period. The first period and the second period are non-overlapping. An input stage generates a first current based on the one of the reference current and the memory cell current during the first period and generates a second current based on the other of the reference current and the memory cell current during the second period. A sensing stage senses a first value based on the first current and stores the first value during the first period, senses a second value based on the second current during the second period and compares the first value to the second value.

35 Claims, 19 Drawing Sheets

US 7,724,596 B1

AUTO-ZERO CURRENT SENSING AMPLIFIER

CROSS-REFERENCE TO RELATED APPLICATIONS

This application claims the benefit of U.S. Provisional Application No. 60/972,498, filed on Sep. 14, 2007. The disclosure of the above application is incorporated herein by reference in its entirety.

FIELD

The present disclosure relates to amplifier circuits, and more particularly to current-sensing amplifiers used in memory integrated circuits (ICs).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a memory integrated circuit (IC) 10 is shown. The memory IC 10 comprises a memory array 12, a decoder 14, and a state sensing circuit 16. The memory array 12 includes an array of memory cells 15. The decoder 14 selects one of the memory cells 15 of the memory array 12. The state sensing circuit 16 senses a state of the selected memory cell 15.

Specifically, the state sensing circuit 16 comprises a voltage source 17 that applies a voltage difference across first and second bit lines (not shown) that are connected to the selected memory cell. The state sensing circuit 16 senses current that flows through the selected memory cell ($I_{cell}$). The value of $I_{cell}$ changes depending on the state of the selected memory cell. Typically, the state sensing circuit 16 utilizes a sense amplifier 18 that senses a voltage drop $V_{cell}$ generated by $I_{cell}$. The sense amplifier 18 compares $V_{cell}$ to a reference voltage $V_{ref}$. For binary memory cells, the sense amplifier 18 determines the state of the selected memory cell based on whether $V_{cell}$ is greater or less than $V_{ref}$.

Referring now to FIG. 2, a typical sense amplifier 50 is shown. The sense amplifier 50 uses a latch-type structure comprising two mirrored circuits, each comprising a differential pair of transistors. Specifically, a first differential pair of transistors $Q_1$ and $Q_2$ is cross-coupled to a second differential pair of transistors $Q_3$ and $Q_4$ as shown. $V_{cell}$ and $V_{ref}$ are input to transistors $Q_3$ and $Q_4$, respectively. The transistors $Q_3$ and $Q_4$ represent two inputs or two input paths of the sense amplifier 50. One input or input path (e.g., $Q_3$) is used for sensing $V_{cell}$ while another input or input path (e.g., $Q_4$) is used for sensing $V_{ref}$.

The sense amplifier 50 compares $V_{cell}$ to $V_{ref}$ and generates outputs $V_1$ and $V_2$ that indicate the state of the selected memory cell. For example, $V_1$ may be positive and $V_2$ may be negative indicating that the state of the selected memory cell is a binary 1 when $V_{cell} > V_{ref}$. Conversely, $V_1$ may be negative and $V_2$ may be positive indicating that the state of the selected memory cell is a binary 0 when $V_{cell} < V_{ref}$.

SUMMARY

A sensing amplifier for a memory cell comprises a selection stage that outputs one of a reference current and a memory cell current during a first period and the other of the reference current and the memory cell current during a second period. The first period and the second period are non-overlapping. An input stage generates a first current based on the one of the reference current and the memory cell current during the first period and generates a second current based on the other of the reference current and the memory cell current during the second period. A sensing stage senses a first value based on the first current and stores the first value during the first period, senses a second value based on the second current during the second period and compares the first value to the second value.

In other features, the second period occurs after the first period. The sensing stage outputs a state selection signal that selects a state of the memory cell based on the comparison. A control module generates control signals defining the first and second periods. The input stage comprises an input transistor having a first terminal that communicates with the selection stage and a second terminal that communicates with the sensing stage. A current stabilizing circuit selectively pulls a voltage of the second terminal up to operate the input transistor in saturation mode.

In other features, the current stabilizing circuit includes a pull-up transistor including a first terminal that communicates with the second terminal of the input transistor. The input stage further comprises a gain booster circuit that increases gain and decreases an input impedance of the input transistor. The input transistor has a first transconductance and includes a control terminal. The gain booster circuit includes an amplifier having a gain, an input that communicates with the first terminal of the input transistor, and an output that communicates with the control terminal of the input transistor.

In other features, the amplifier decreases the input impedance based on an inverse of a product of the gain and the first transconductance. The sensing stage comprises a sensing circuit that senses the first and second values. A sample-and-hold circuit samples and holds the first value. The sensing circuit includes first and second transistors that selectively operate in a diode configuration when the second terminal is pulled-up. Control terminals of the first and second transistors communicate with each other. The sample-and-hold circuit includes a third transistor having a control terminal that communicates with the control terminals of the first and second transistors. A switch selectively connects the control terminal of the third transistor to the second terminal of the input transistor.

In other features, the switch selectively connects the control terminal of the third transistor to the second terminal of the input transistor. The sensing circuit includes a voltage controlled current source (VCCS). A buffer connects the switch to the second terminal and that isolates the third transistor from the second terminal of the input transistor. The second terminal has a first voltage when the second value is greater than the first value and a second voltage when the second value is less than the first value, where the first voltage is different than the second voltage. A buffer outputs a first binary state after voltage at the second terminal switches from the first voltage to the second voltage and outputs a second binary state after the voltage at the second terminal switches from the second voltage to the first voltage. The buffer includes one of an inverter and a voltage amplifier.

In other features, an integrated circuit comprises the sensing amplifier and further comprises a decoder. A memory array comprises a plurality of memory cells. The decoder selects the memory cell from the plurality of memory cells.

In other features, a solid-state drive (SSD) comprises the integrated circuit. A data storage system comprises a storage area network (SAN) control module that controls a plurality of storage units each comprising a plurality of the SSD.

In still other features, a method for operating a sensing amplifier for a memory cell comprises selecting one of a reference current and a memory cell current during a first period; selecting the other of the reference current and the memory cell current during a second period, wherein the first period and the second period are non-overlapping; generating a first current based on the one of the reference current and the memory cell current during the first period; generating a second current based on the other of the reference current and the memory cell current during the second period; sensing a first value based on the first current and storing the first value during the first period; sensing a second value based on the second current during the second period; and comparing the first value to the second value.

In other features, the second period occurs after the first period. The method includes generating a state selection signal to select a state of the memory cell based on the comparison. The method includes generating control signals defining the first and second periods. The method includes providing an input transistor having a first terminal that communicates with a selection stage and a second terminal that communicates with a sensing stage; and selectively pulling a voltage of the second terminal up to operate the input transistor in saturation mode.

In other features, the method includes providing a pull-up transistor including a first terminal that communicates with the second terminal of the input transistor. The method includes providing a gain booster circuit that increases gain and decreases an input impedance of the input transistor. The input transistor has a first transconductance and includes a control terminal. The gain booster circuit includes an amplifier having a gain, an input that communicates with the first terminal of the input transistor, and an output that communicates with the control terminal of the input transistor. The amplifier decreases the input impedance based on an inverse of a product of the gain and the first transconductance.

In other features, the method includes sensing the first and second values; and sampling and holding the first value. The method includes selectively operating first and second transistors in a diode configuration when the second terminal is pulled-up. The second terminal has a first voltage when the second value is greater than the first value and a second voltage when the second value is less than the first value, where the first voltage is different than the second voltage.

In other features, the method includes providing a buffered output at a first binary state after voltage at the second terminal switches from the first voltage to the second voltage and at a second binary state after the voltage at the second terminal switches from the second voltage to the first voltage.

In still other features, a sensing amplifier for a memory cell comprises selection means for outputting one of a reference current and a memory cell current during a first period and the other of the reference current and the memory cell current during a second period. The first period and the second period are non-overlapping. Input means generates a first current based on the one of the reference current and the memory cell current during the first period and generates a second current based on the other of the reference current and the memory cell current during the second period. Sensing means senses a first value based on the first current and stores the first value during the first period, senses a second value based on the second current during the second period and compares the first value to the second value.

In other features, the second period occurs after the first period. The sensing means outputs a state selection signal that selects a state of the memory cell based on the comparison. Control means generates control signals defining the first and second periods. The input means comprises an input transistor having a first terminal that communicates with the selection means and a second terminal that communicates with the sensing means. Current stabilizing means selectively pulls a voltage of the second terminal up to operate the input transistor in saturation mode.

In other features, the current stabilizing means includes a pull-up transistor including a first terminal that communicates with the second terminal of the input transistor. The input means further comprises gain booster means for increasing gain and decreasing an input impedance of the input transistor.

In other features, the input transistor has a first transconductance and includes a control terminal. The gain booster means includes an amplifier having a gain, an input that communicates with the first terminal of the input transistor, and an output that communicates with the control terminal of the input transistor.

In other features, the amplifier decreases the input impedance based on an inverse of a product of the gain and the first transconductance. The sensing means comprises value sensing means for sensing the first and second values and sample-and-hold means for sampling and holding the first value. The sensing means includes first and second transistors that selectively operate in a diode configuration when the second terminal is pulled-up. Control terminals of the first and second transistors communicate with each other. The sample-and-hold means includes a third transistor having a control terminal that communicates with the control terminals of the first and second transistors. Switch means selectively connects the control terminal of the third transistor to the second terminal of the input transistor.

In other features, the switch means selectively connects the control terminal of the third transistor to the second terminal of the input transistor. The sensing means includes a voltage controlled current source (VCCS). Buffer means connects the switch to the second terminal and isolates the third transistor from the second terminal of the input transistor. The second terminal has a first voltage when the second value is greater than the first value and a second voltage when the second value is less than the first value, where the first voltage is different than the second voltage. Buffer means outputs a first binary state after voltage at the second terminal switches from the first voltage to the second voltage and outputs a second binary state after the voltage at the second terminal switches from the second voltage to the first voltage. The buffer means includes one of an inverter and a voltage amplifier.

In other features, an integrated means comprises the sensing amplifier and further comprises decoding means for decoding. A memory array comprises a plurality of memory cells. The decoder means selects the memory cell from the plurality of memory cells.

In other features, a solid-state drive (SSD) comprises the integrated circuit. A data storage system comprises a storage area network (SAN) control means for controlling a SAN. The SAN control means controls a plurality of storage units each comprising a plurality of the SSD.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
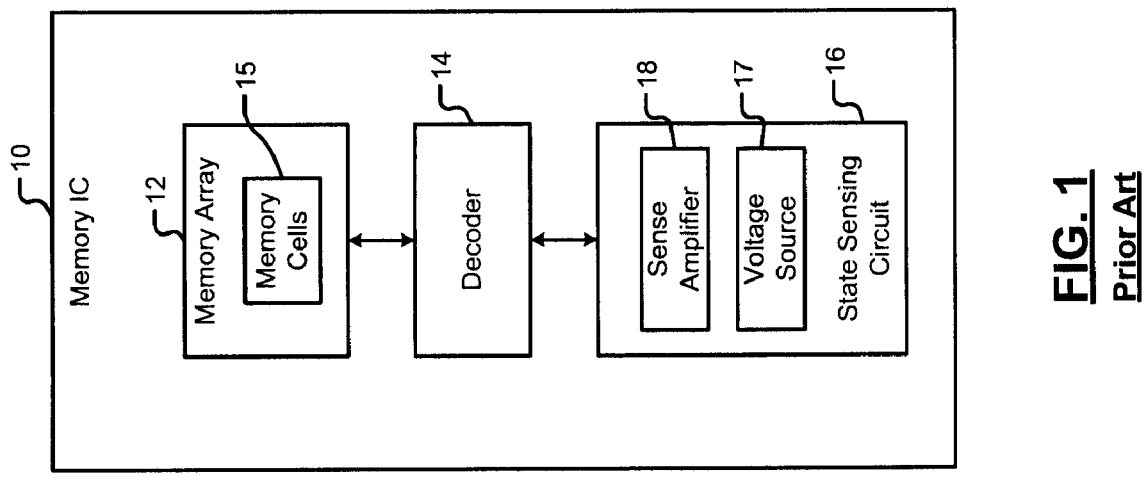
FIG. 1 is a functional block diagram of an exemplary memory integrated circuit (IC) according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
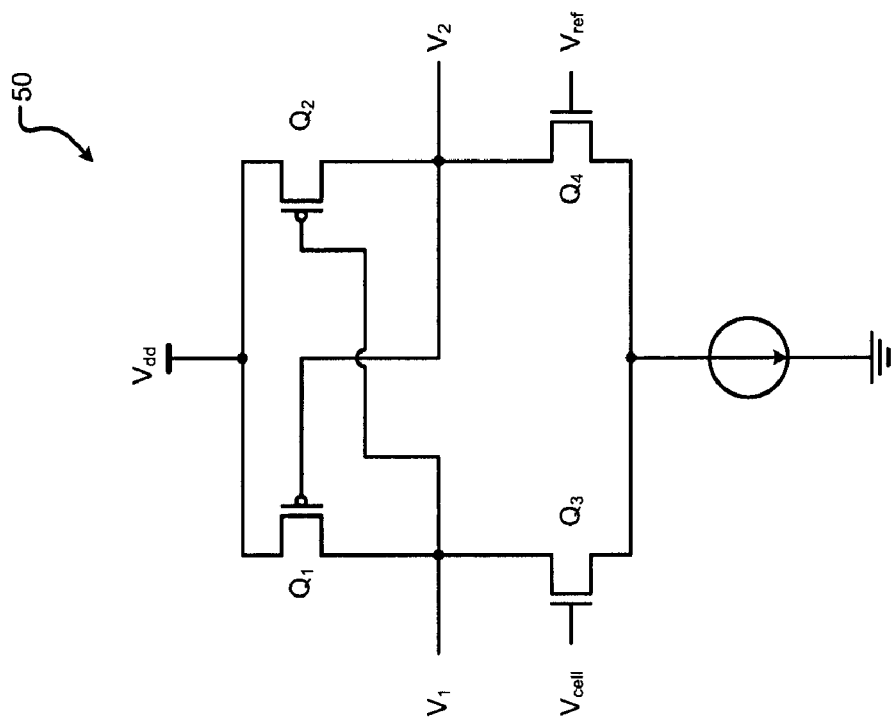
FIG. 2 is a circuit diagram of an exemplary voltage sensing amplifier according to the prior art.

To accurately detect $I_{cell}$ (or $V_{cell}$) using the sense amplifiers of FIG. 2, the transistors used in the differential pairs need to have matching electrical characteristics. For example, the electrical characteristics of transistors $Q_1$ and $Q_3$ of the sense amplifier 50 need to match the electrical characteristics of transistors $Q_2$ and $Q_4$, respectively. Practically, however, the electrical characteristics of the transistors may have some mismatch. For example, the electrical characteristics of transistors $Q_1$ and $Q_3$ may not exactly match the electrical characteristics of transistors $Q_2$ and $Q_4$, respectively. The mismatch may limit the ability of the sense amplifier 50 to accurately detect $I_{cell}$ or $V_{cell}$. Consequently, the mismatch may limit the ability of the state sensing circuit 16 to accurately sense the state of the selected memory cell. Additionally, using differential pairs of transistors takes up valuable layout space in memory integrated circuits (ICs), which increases cost.

The present disclosure relates to a sense amplifier (e.g., an auto-zero current sensing amplifier) that reduces problems caused by mismatched circuit elements and reduces layout space. Specifically, the sensing amplifier according to the present disclosure uses the same input path to sense both $I_{cell}$ and a reference current $I_{ref}$. Additionally, the sensing amplifier uses the same circuit to stabilize both $I_{cell}$ and $I_{ref}$. Finally, the sensing amplifier uses only the same circuit to sense and store a value of $I_{cell}$ (or $I_{ref}$) and to sense and compare a value of $I_{ref}$ (or $I_{cell}$) to the stored value of $I_{cell}$ (or $I_{ref}$). Using the same input path for sensing both $I_{cell}$ and $I_{ref}$ and using the same circuits for stabilizing and comparing $I_{cell}$ and $I_{ref}$ eliminates the problem posed by mismatched electrical characteristics of transistors and decreases layout space for the current sensing amplifier.

More specifically, the sensing amplifier uses a current selection stage to initially select and sense $I_{cell}$ (or $I_{ref}$). The sensing amplifier comprises an input stage that communicates with the current selection stage and provides a low input impedance so that $I_{cell}$ (or $I_{ref}$) is sensed accurately. The input stage includes an input transistor that is operated in saturation mode to stabilize $I_{cell}$ (or $I_{ref}$). Additionally, the sensing amplifier comprises a current sensing stage that communicates with the input stage and that senses and stores the value of $I_{cell}$ (or $I_{ref}$).

Thereafter, the current selection stage deselects $I_{cell}$ (or $I_{ref}$) and selects $I_{ref}$ (or $I_{cell}$). The sensing amplifier uses the same input path to sense $I_{ref}$ (or $I_{cell}$). The sensing amplifier uses the same input stage to stabilize $I_{ref}$ (or $I_{cell}$). Finally, the sensing amplifier uses the same current sensing stage to sense and compare $I_{ref}$ (or $I_{cell}$) to the stored value of $I_{cell}$ (or $I_{ref}$). Based on the comparison, the sensing amplifier determines the state of the selected memory cell.

Figure 3:
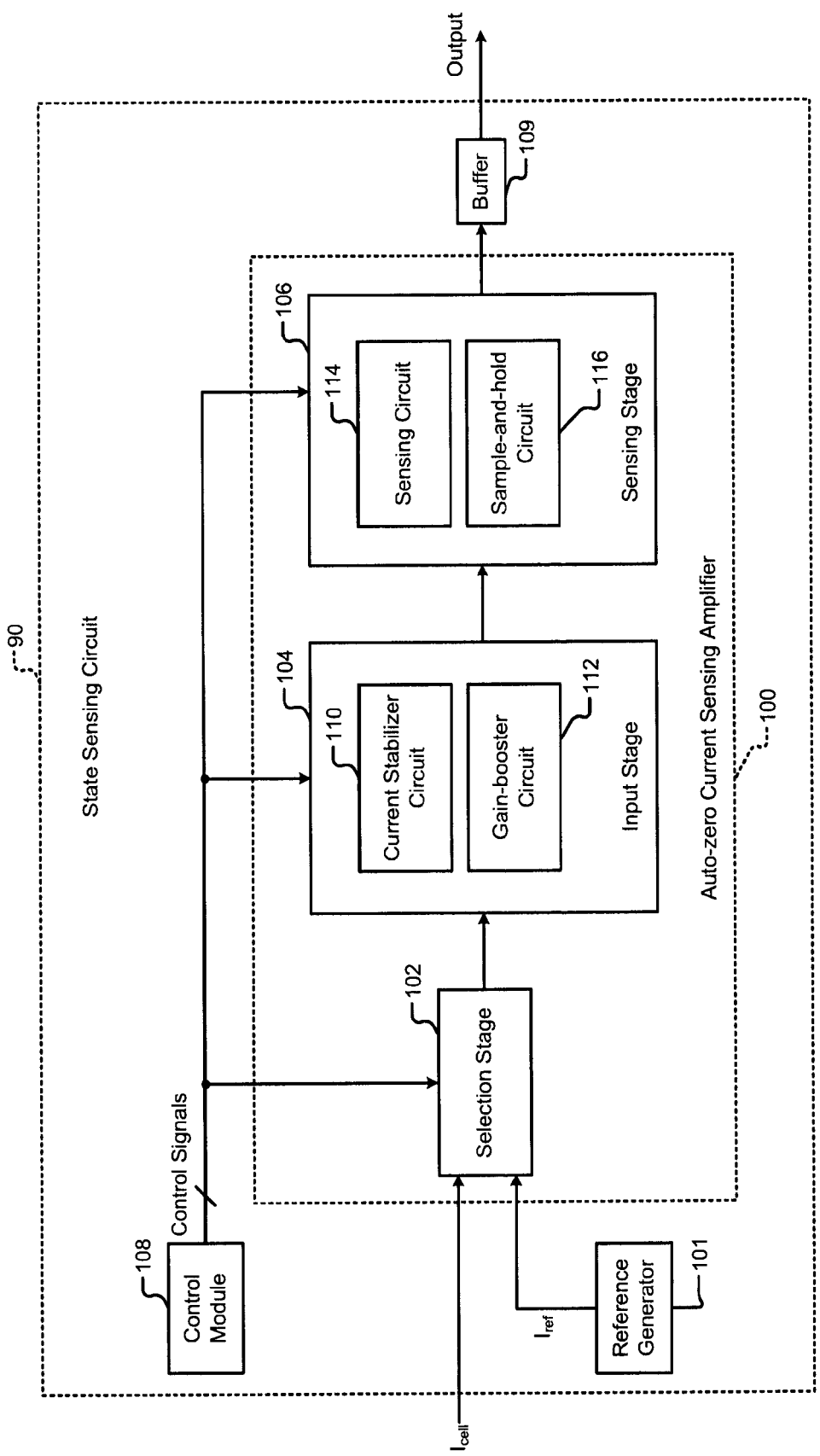
FIG. 3 is a functional block diagram of an exemplary sensing amplifier according to the present disclosure.
Figure 4A:
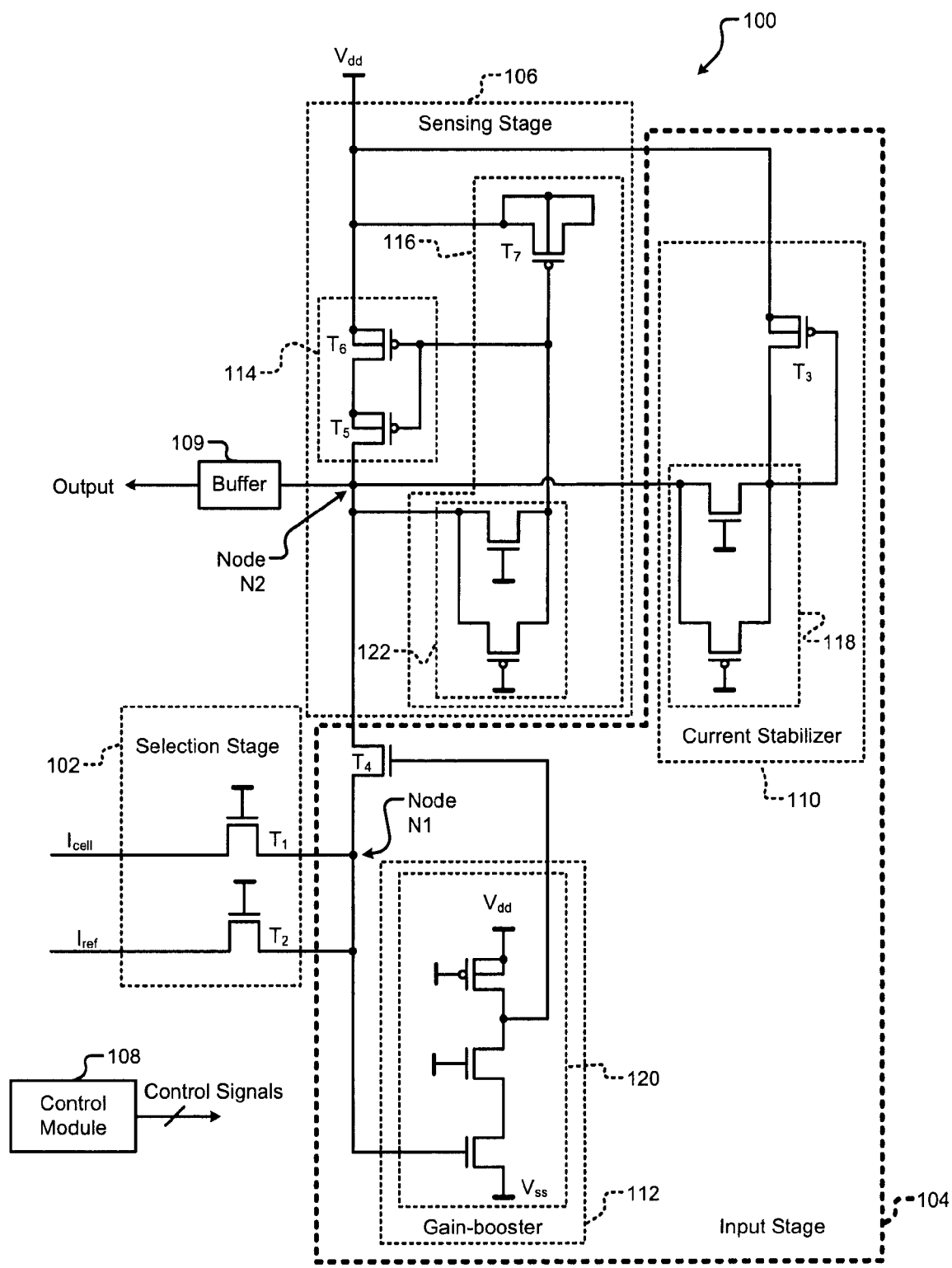
FIG. 4A is a circuit diagram of an exemplary sensing amplifier according to the present disclosure.
Figure 4B:
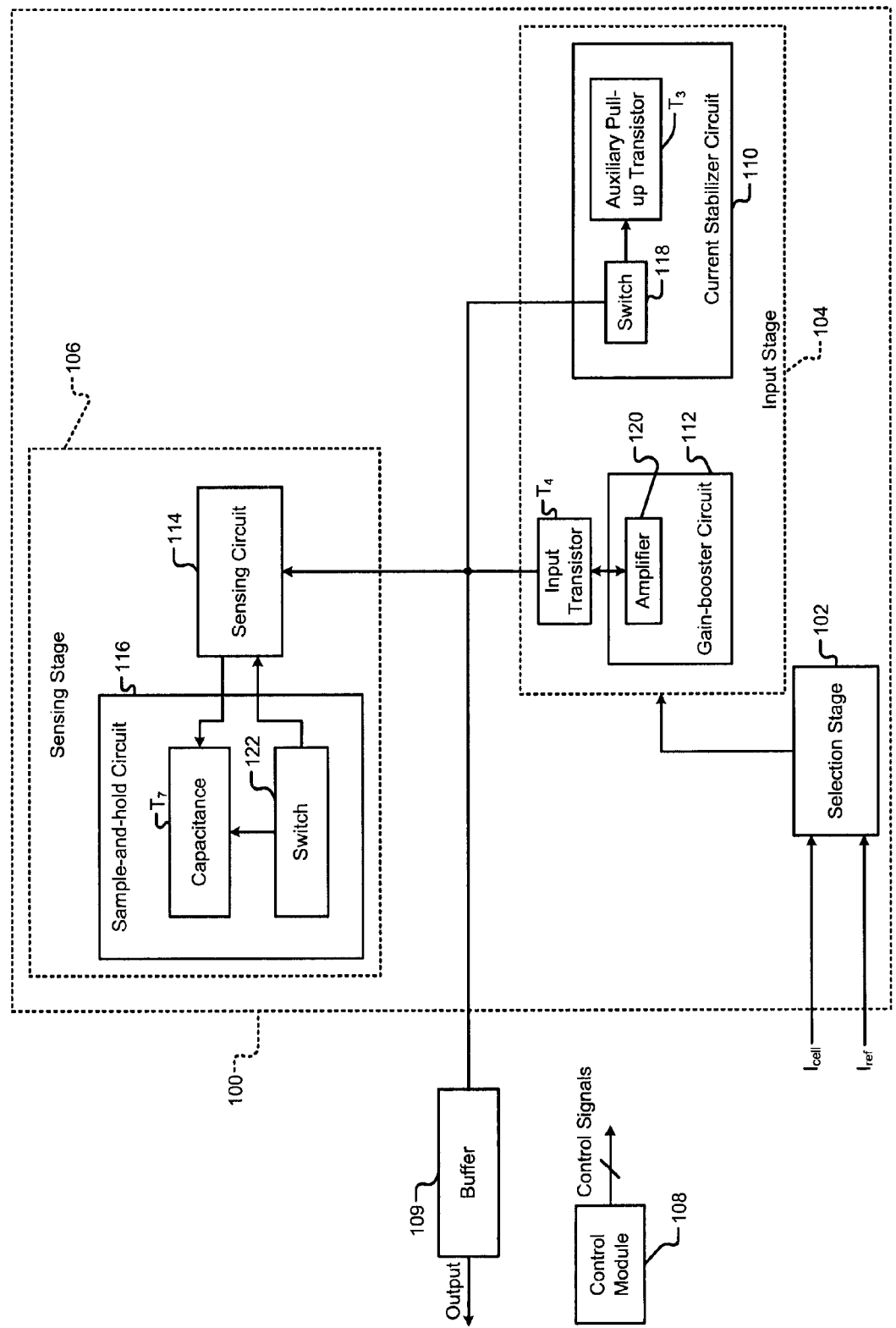
FIG. 4B is a functional block diagram of an exemplary sensing amplifier according to the present disclosure.
Figure 4C:
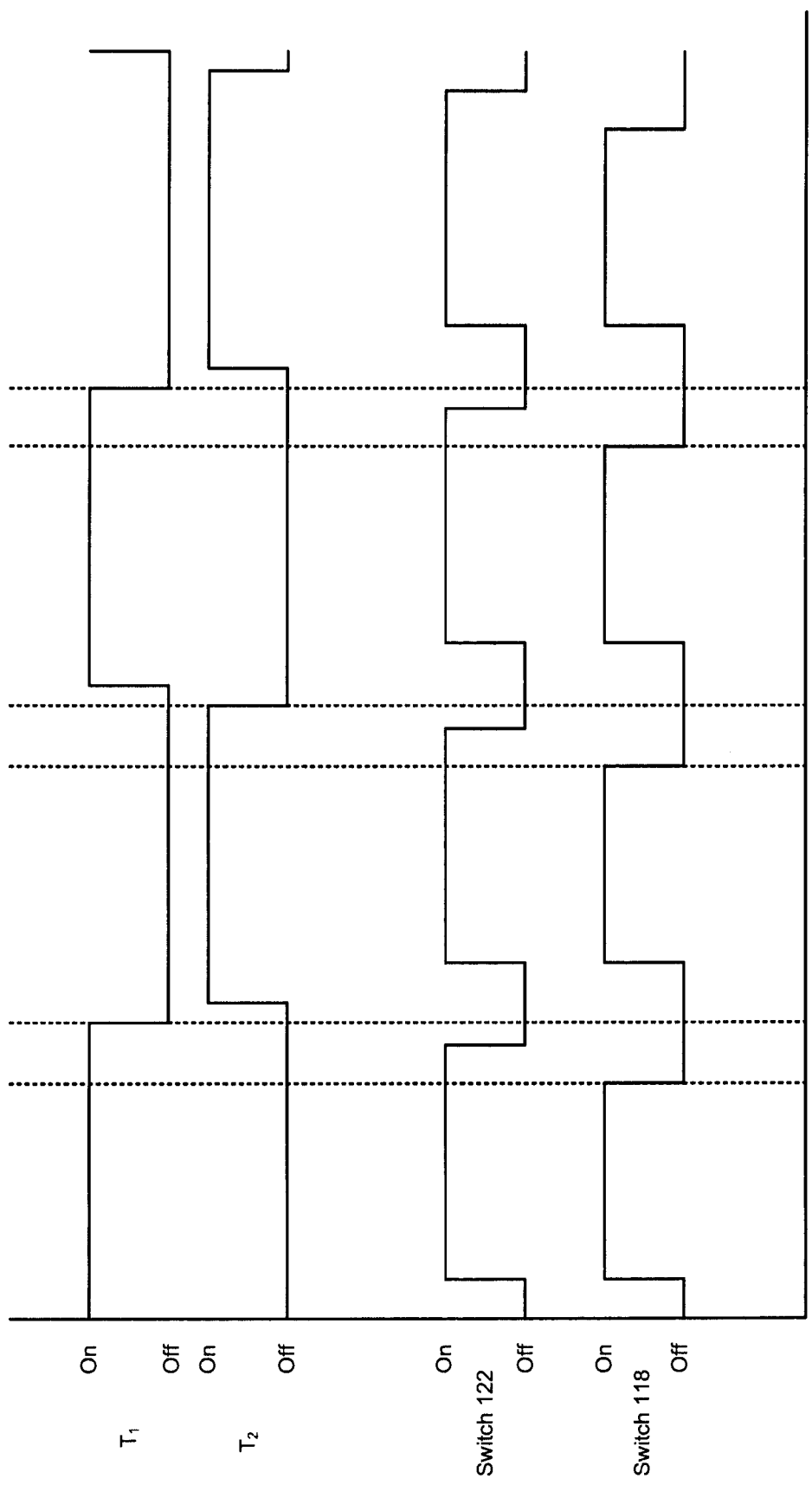
FIG. 4C is a timing diagram of control signals that control the sensing amplifier of FIG. 4A.
Figure 4D:
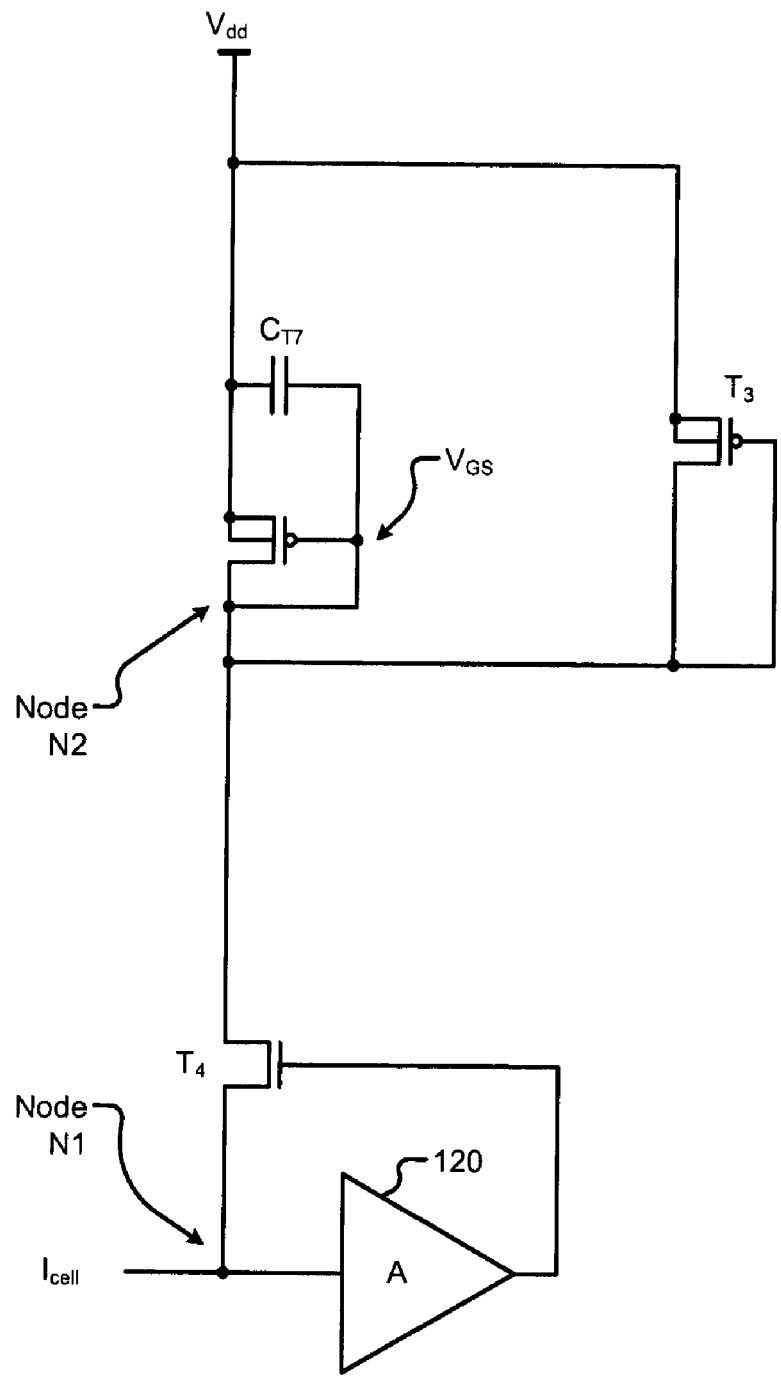
FIGS. 4D-4F are simplified schematics of the circuit diagram of FIG. 4A according to the present disclosure.
Figure 4E:
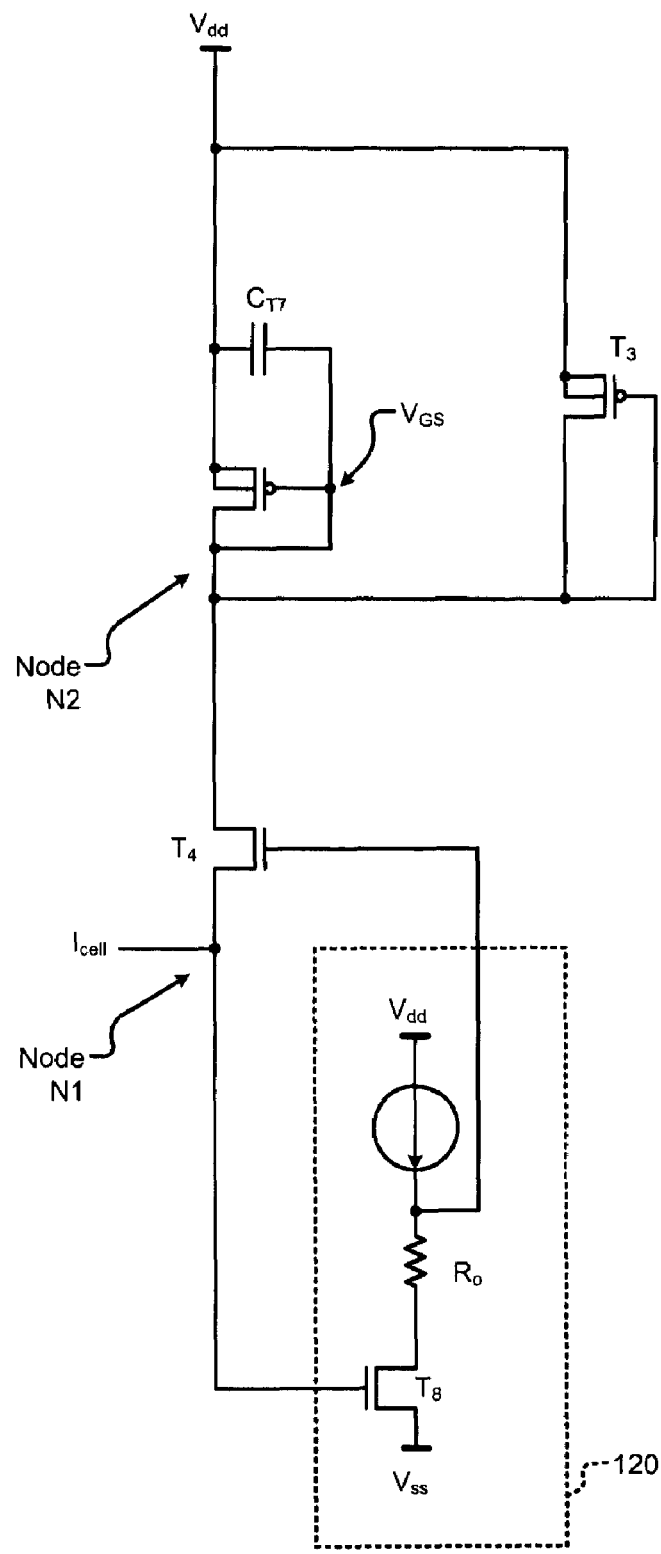
Figure 4F:
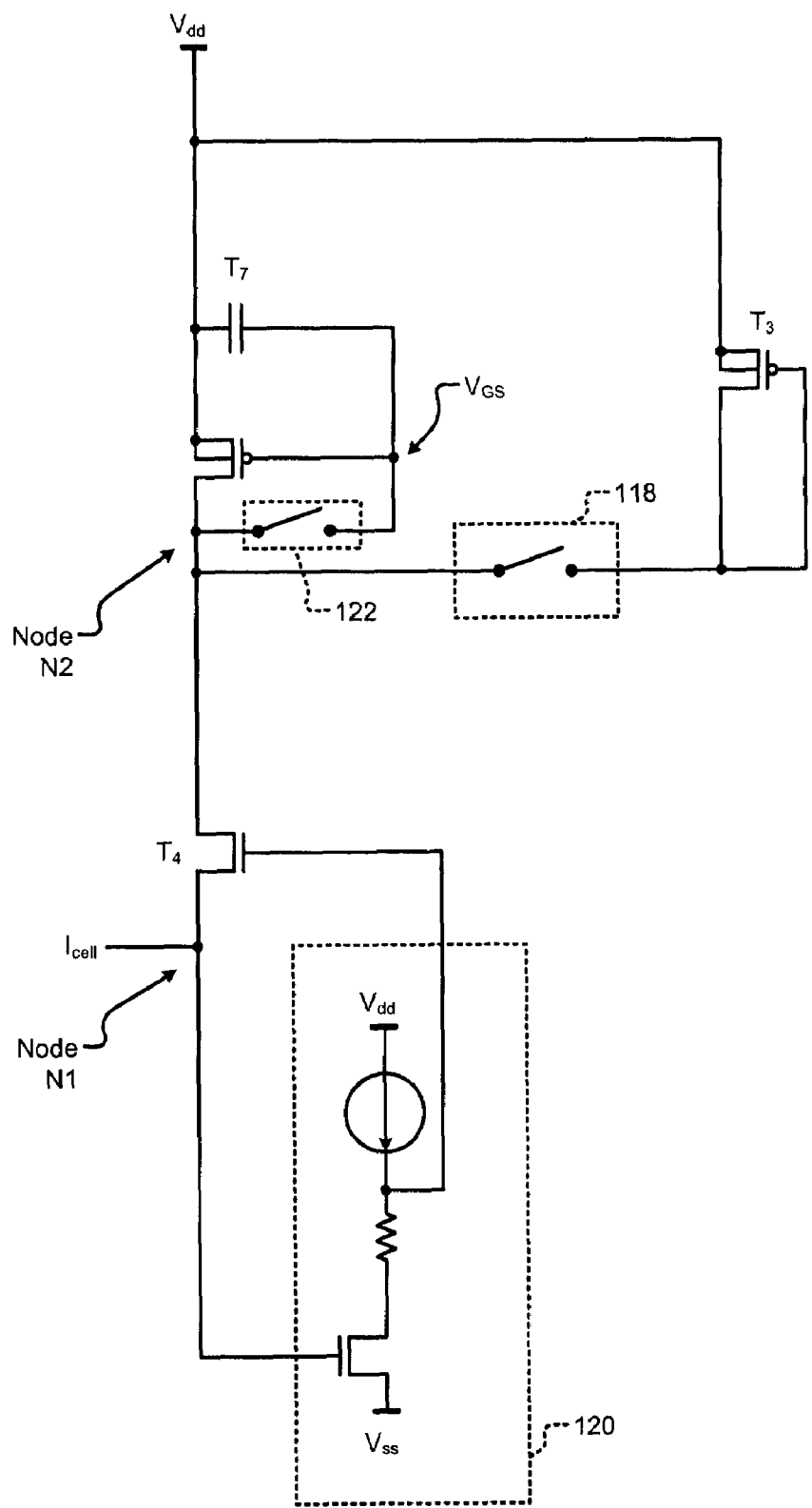
Figure 5A:
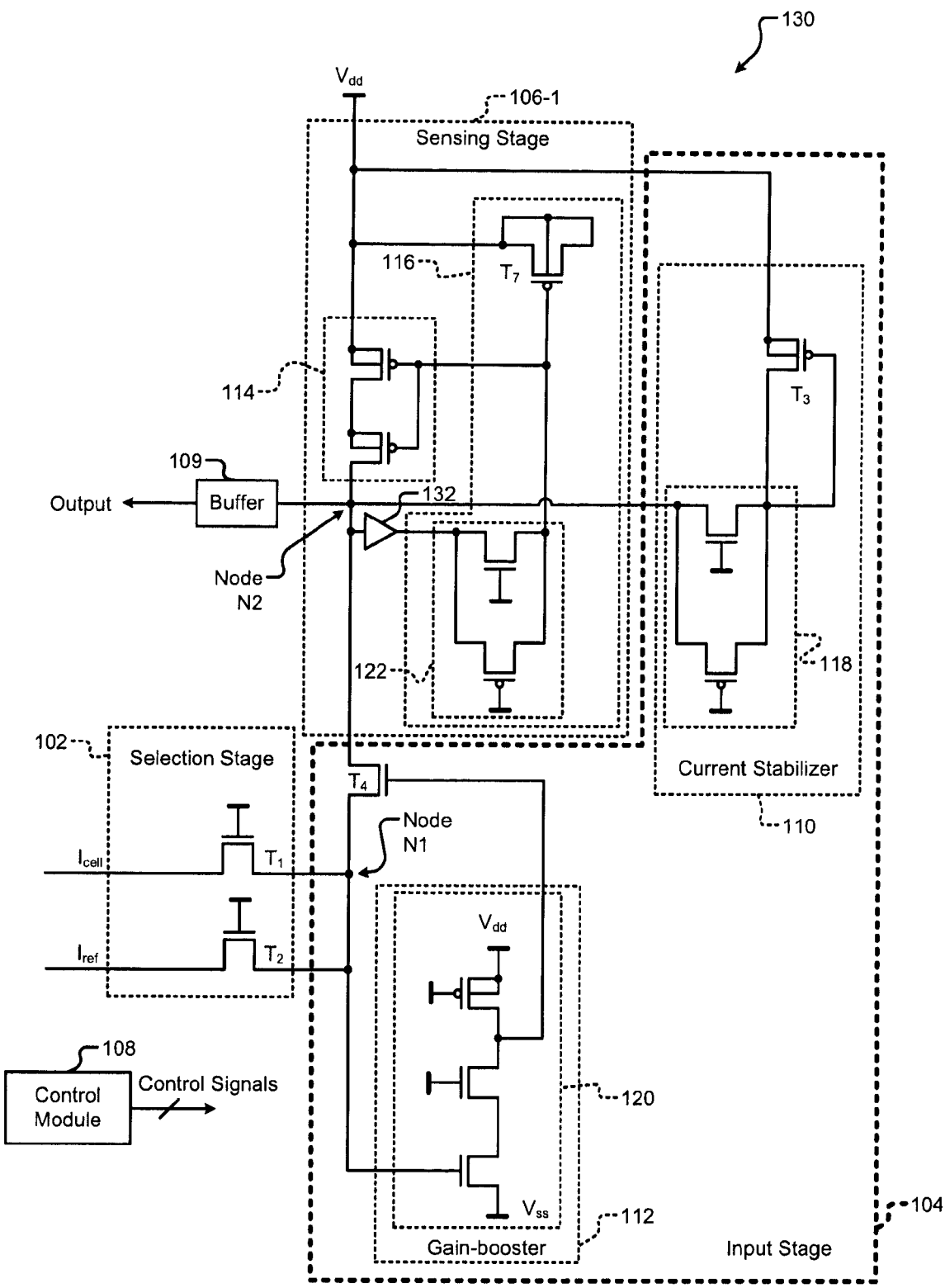
FIGS. 5A and 5B are circuit diagrams of exemplary sensing amplifiers according to the present disclosure.
Figure 5B:
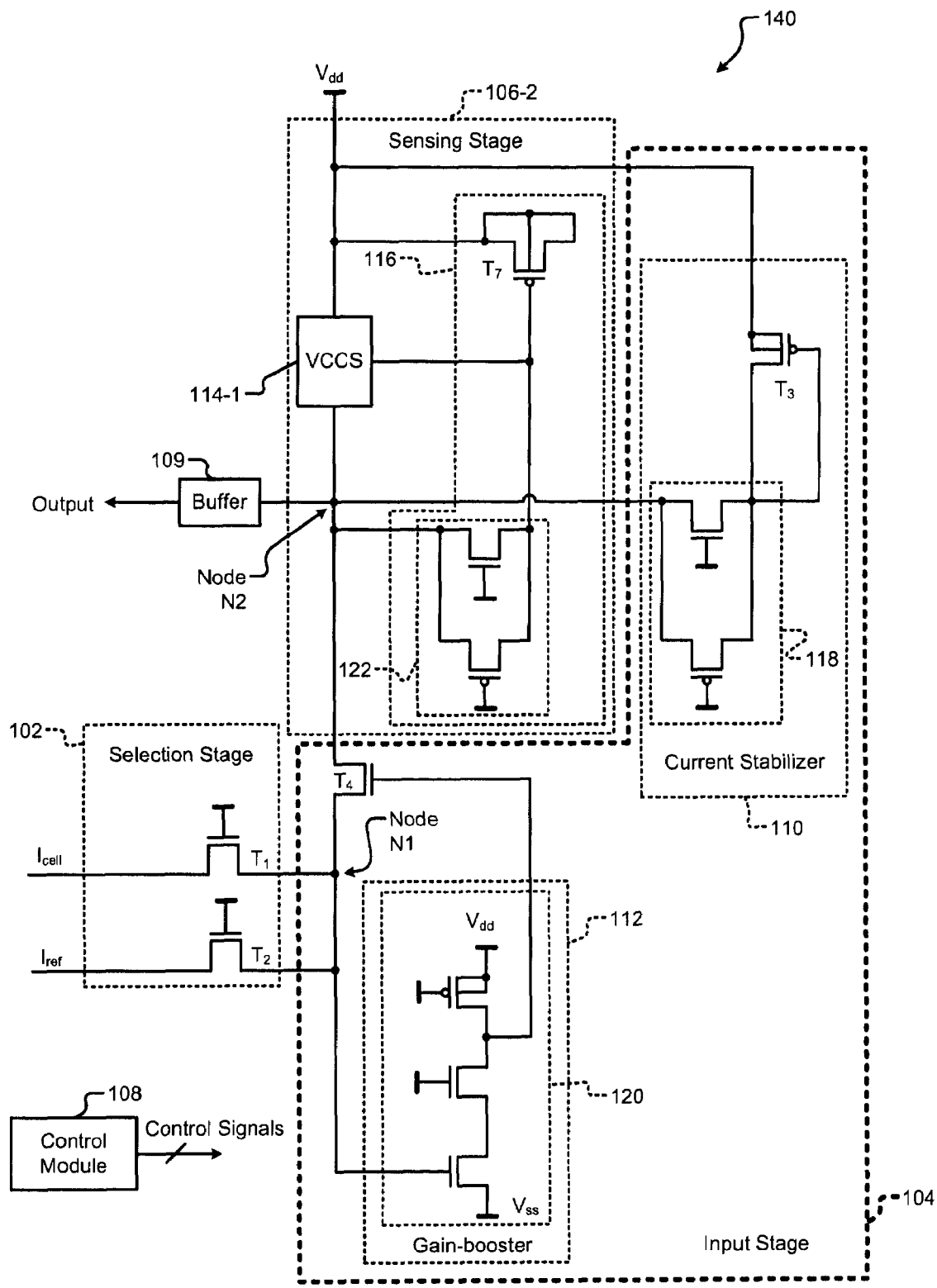
Figure 6A:
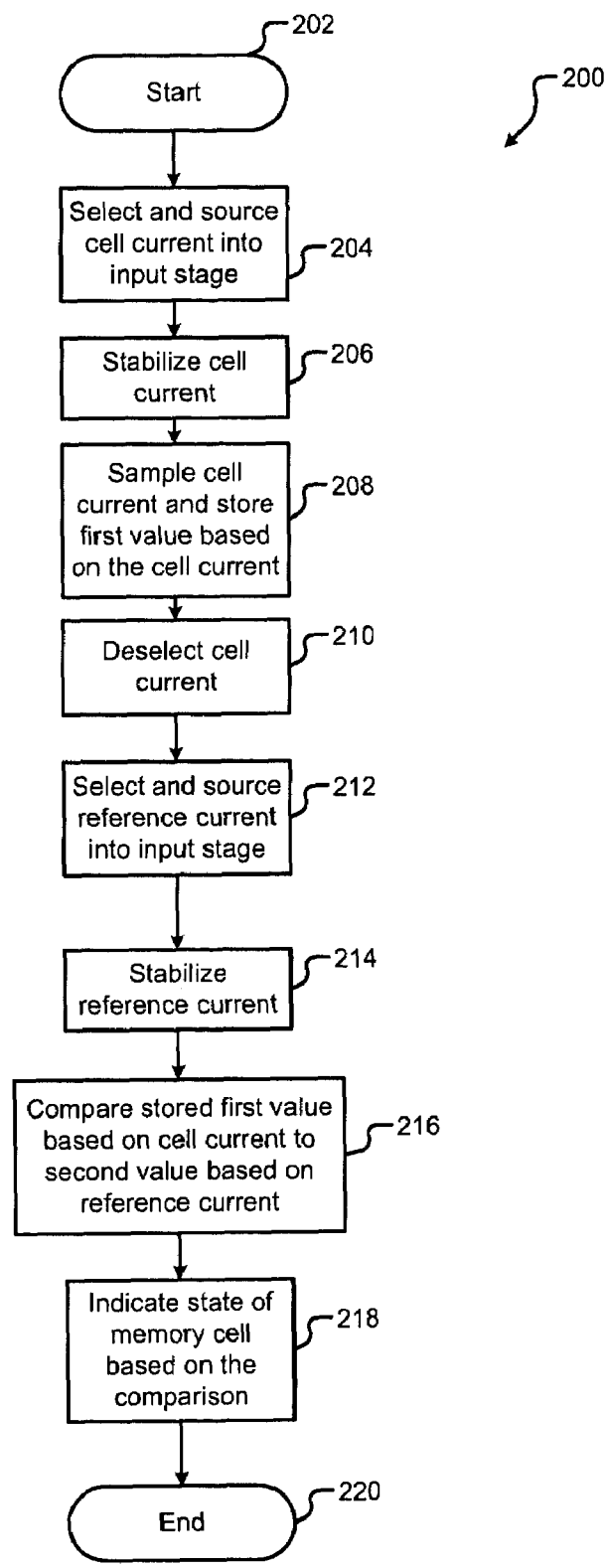
FIGS. 6A and 6B are flowcharts of exemplary methods for implementing a sensing amplifier according to the present disclosure.
Figure 6B:
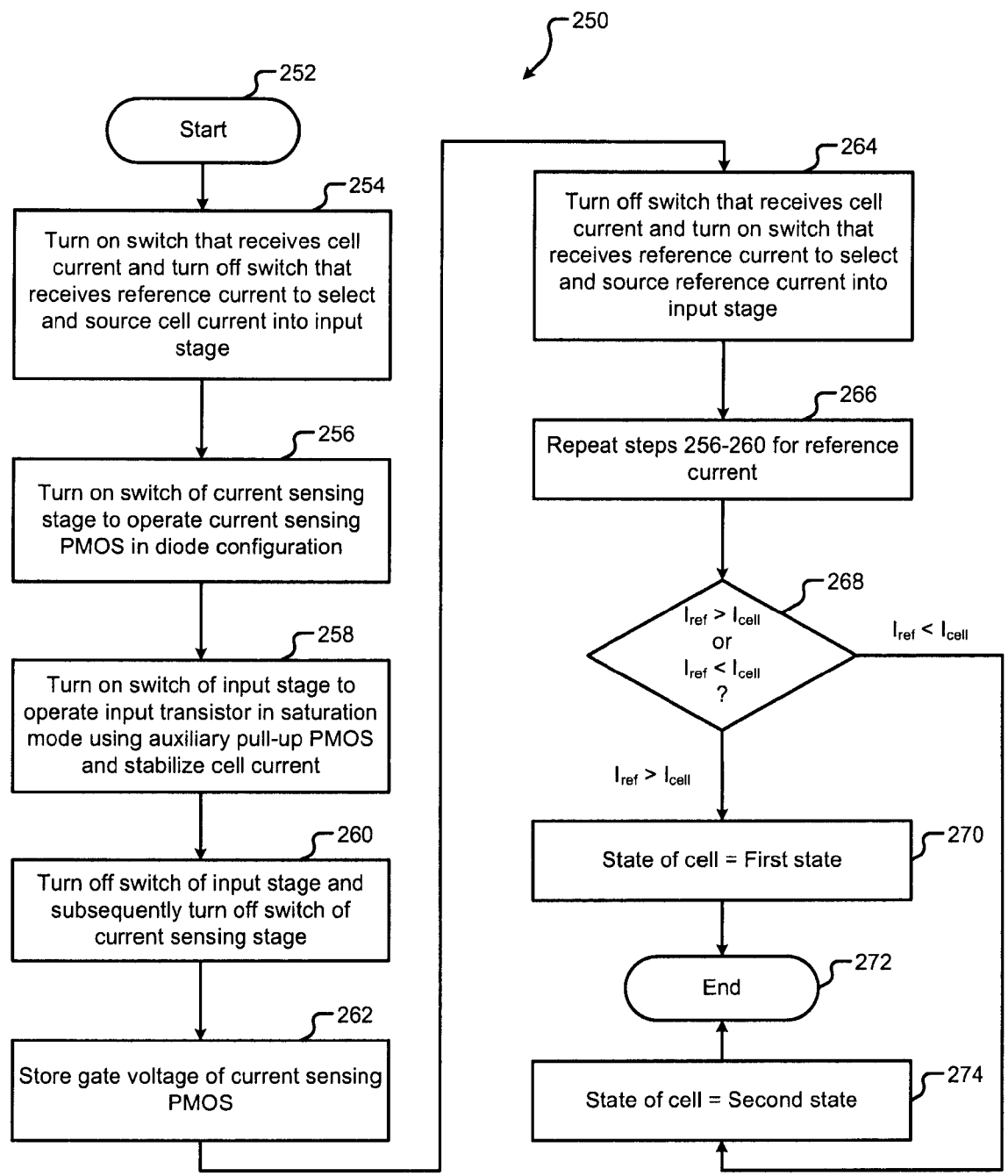
Figure 7A:
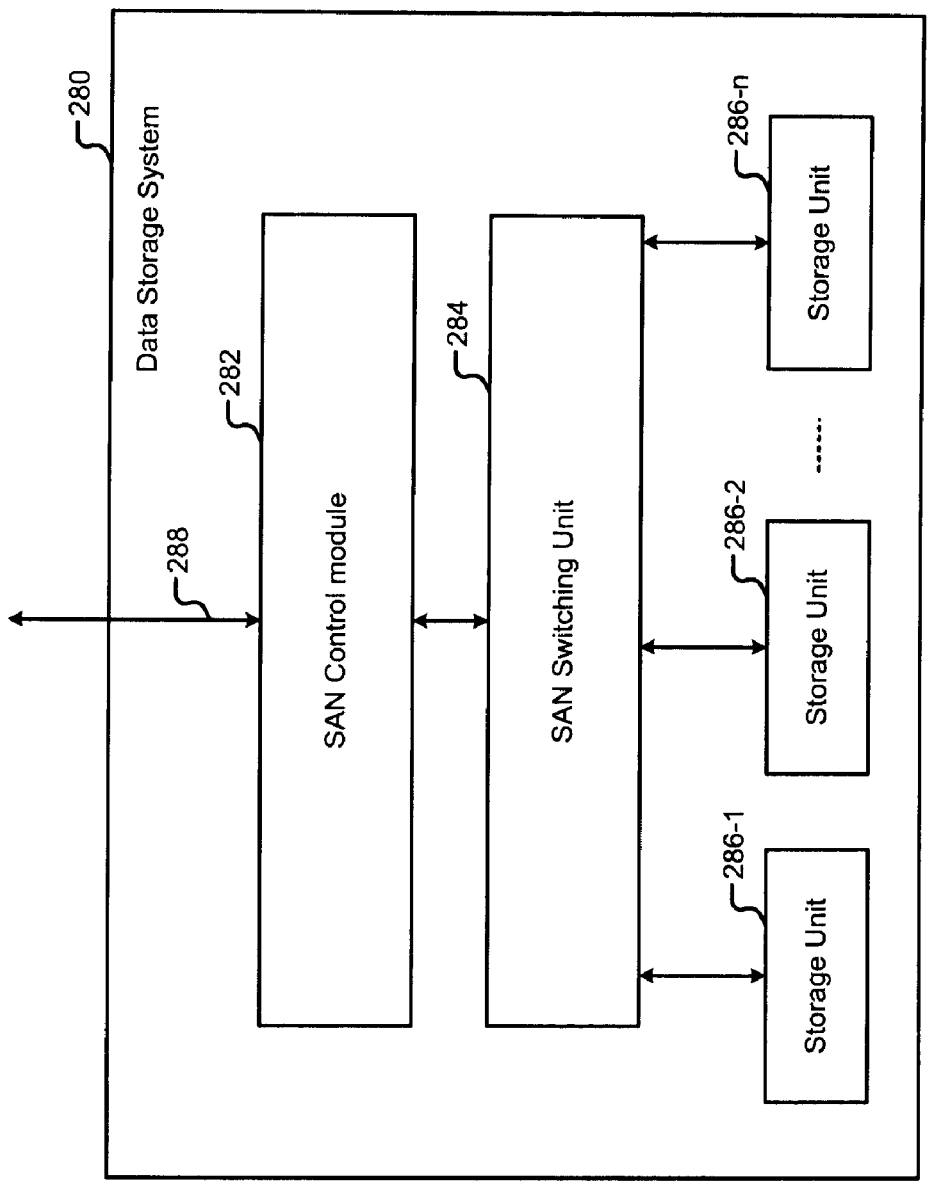
FIG. 7A is a functional block diagram of a data storage system comprising storage units according to the present disclosure.
Figure 7B:
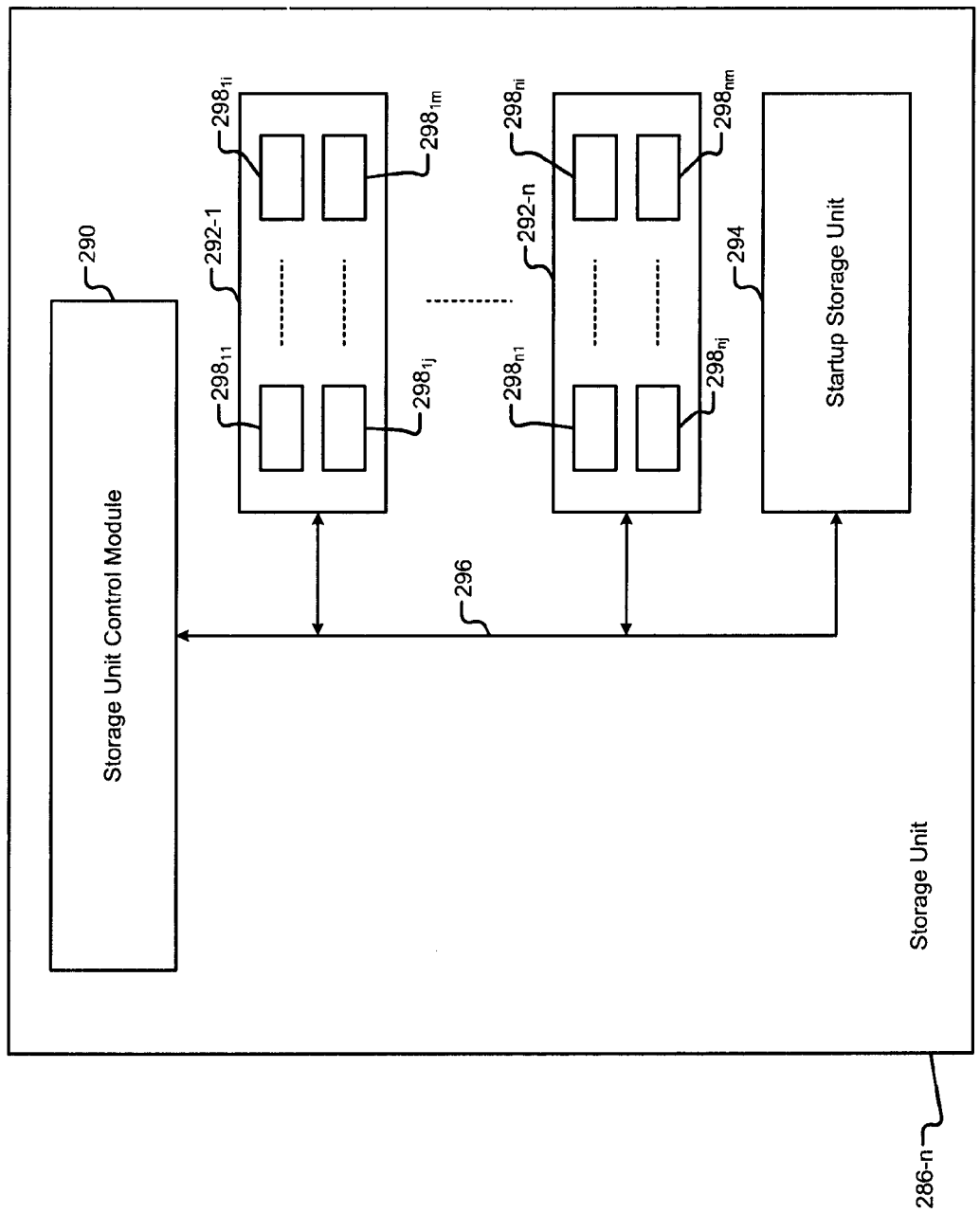
FIG. 7B is a functional block diagram of a storage unit of the data storage system of FIG. 7A according to the present disclosure.

Before a detailed discussion, a brief description of drawings is presented. FIG. 3 shows a high-level functional block diagram of a sensing amplifier. FIG. 4A shows a detailed circuit diagram of a sensing amplifier. FIG. 4B shows a block-diagram that illustrates main circuit blocks of the circuit of FIG. 4A. FIG. 4C shows timing of control signals that control the sensing amplifier. FIGS. 4D-4F show resultant schematics of the circuit of FIG. 4A when the circuit is operated according to the control signals of FIG. 4C. FIGS. 5A and 5B show additional circuit configurations of sensing amplifiers. FIGS. 6A and 6B show high-level and detailed flowcharts of a method for implementing a sensing amplifier, respectively. FIGS. 7A and 7B show examples of data storage systems and storage units that utilize the sensing amplifiers.

Referring now to FIG. 3, a state sensing circuit 90 comprising an exemplary sensing amplifier 100 is shown. The state sensing circuit 90 comprises the sensing amplifier 100, a reference generator 101, a control module 108, and a buffer 109. The sensing amplifier 100 comprises a current selection stage 102, an input stage 104, and a current sensing stage 106. The reference generator 101 generates the reference current $I_{ref}$. The control module 108 generates control signals that control various circuits of the current selection stage 102, the input stage 104, and the current sensing stage 106. The buffer 109 buffers an output of the sensing amplifier 100.

More specifically, the current selection stage 102 receives currents $I_{cell}$ and $I_{ref}$ from the selected memory cell (not shown) and the reference generator 101, respectively. Based on the control signals, the current selection stage 102 selects $I_{cell}$ or $I_{ref}$ and inputs a selected current (i.e., $I_{cell}$ or $I_{ref}$) to the input stage 104. For example, the current selection stage 102 may select $I_{cell}$ during a first period and $I_{ref}$ during a second period. Alternatively, the current selection stage 102 may select $I_{ref}$ during the first period and $I_{cell}$ during the second period.

The input stage 104 comprises a current stabilizer circuit 110. The current stabilizer circuit 110 stabilizes the selected current and outputs the selected current to the current sensing stage 106.

Throughout the disclosure, the terms stabilized current and stabilized voltage mean the following. Current I and voltage V, for example, when stabilized, may have values of (I±x %) and (V±y %), respectively. Typically, x and y may be small numbers (integers or non-integers). For example only, x and y may range between 0 and 10.

In some implementations, the input stage 104 may further comprise a gain-booster circuit 112. The gain-booster circuit 112 increases gain and decreases input impedance of the input stage 104. The gain booster circuit 112 may be excluded when signals at a node of the selection stage 102 and the input stage 104 follow signals at a node of the buffer 109 and the sensing stage 106 during normal operation. As used herein, the term "follow" means without substantial attenuation.

The current sensing stage 106 comprises a sensing circuit 114 and a sample-and-hold circuit 116. The sensing circuit 114 senses the selected current output by the current stabilizer circuit 110. The sample-and-hold circuit 116 stores a value of the selected current output by the current stabilizer circuit 110. For example, when the current selection stage 102 selects $I_{cell}$, the current stabilizer circuit 110 stabilizes $I_{cell}$. The sensing circuit 114 senses a value of $I_{cell}$ output by the current stabilizer circuit 110. The sample-and-hold circuit 116 stores the value of $I_{cell}$ output by the current stabilizer circuit 110.

Subsequently, the current selection stage 102 deselects $I_{cell}$ and selects $I_{ref}$. The current stabilizer circuit 110 stabilizes $I_{ref}$. The sensing circuit 114 senses a value of $I_{ref}$ output by the current stabilizer circuit 110 and compares the value of $I_{ref}$ output by the current stabilizer circuit 110 to the stored value of $I_{cell}$. Based on the comparison, the current sensing stage 106 generates an output that is input to the buffer 109. The buffer 109 may comprise a voltage amplifier or an inverter. The buffer 109 generates an output that indicates the state of the selected memory cell.

Referring now to FIGS. 4A-4F, an exemplary circuit of the sensing amplifier 100 is shown. In FIG. 4A, to simplify circuit description, the circuit diagram is divided into various main circuit blocks shown by dotted lines. A brief description of the main circuit blocks follows.

The current selection stage 102 includes first and second transistors $T_1$ and $T_2$. However, any suitable switching devices may be used. The input stage 104 includes an input transistor $T_4$. The current stabilizer circuit 110 includes a switch 118 and an auxiliary pull-up transistor $T_3$. The sensing circuit 114 includes current sensing transistors $T_5$ and $T_6$. Transistors $T_5$ and $T_6$ may include long-channel current sensing positive metal-oxide semiconductor (PMOS) transistors. However, any other suitable current sensing devices may be used. The sample-and-hold circuit 116 includes a switch 122 and a transistor $T_7$. FIG. 4B shows the main circuit blocks in the form of a block diagram.

A detailed description of the circuit of FIG. 4A is now presented. The description can be best understood by viewing together the circuit of FIG. 4A and the timing diagram of the control signals shown in FIG. 4C. Additionally, viewing FIGS. 4D-4F when referenced can help in understanding the operation of the circuit of FIG. 4A.

In FIG. 4A, the control module 108 initially generates control signals that turn on transistor $T_1$ and turn off transistor $T_2$. When transistor $T_1$ turns on, current $I_{cell}$ is selected and input to node N1. Since transistor $T_2$ is off, current $I_{ref}$ is not selected and not input to node N1.

Subsequently, the control module 108 generates control signals that concurrently turn on switches 122 and 118. When switch 122 is turned on, the current sensing transistors $T_5$ and $T_6$ operate in a diode configuration. When switch 118 is turned on, the auxiliary pull-up transistor $T_3$ pulls up node N2. The resultant circuit is shown in FIG. 4D.

Although included in the figures and discussed throughout the disclosure, the gain booster circuit 112 may be excluded when the signals at node N2 follow the signals at node N1 during normal operation. In other words, the gain booster circuit 112 need not be used when the signals at node N2 are not substantially attenuated relative to the signals at node N1 during normal operation.

When used, the gain-booster circuit 112 includes an amplifier 120. In the input stage 104, the output of the input transistor $T_4$ is fed back to the gate of the input transistor $T_4$ via the amplifier 120. The amplifier 120 increases the gain and decreases the input impedance of the input transistor $T_4$ from $(1/g_{m4})$ to $(1/(A*g_{m4}))$, where $g_{m4}$ is a transconductance of transistor $T_4$, and A is a gain of the amplifier 120.

FIG. 4E shows an exemplary circuit diagram of the amplifier 120. The amplifier 120 may include a current source, a resistive load $R_o$, and a transistor $T_8$ having a transconductance $g_{m8}$. The gain A of the amplifier 120 is mathematically expressed by the equation $A=(g_{m8})*(R_o)$. As an example, A may be of the order of 100.

When the auxiliary pull-up transistor $T_3$ pulls up node N2, the node N2 is at a higher potential than node N1. Consequently, the input transistor $T_4$ is in saturation mode. Since the input transistor $T_4$ is in the saturation mode, and since the input impedance of the input transistor $T_4$ is decreased by the amplifier 120, signals (e.g., current $I_{cell}$) at nodes N1 and N2 have substantially the same magnitude, and minimal or no attenuation of signals occurs. Consequently, current $I_{cell}$ is quickly stabilized. A gate voltage $V_{GS}$ of transistors $T_5$ and $T_6$ represents the value of the current $I_{cell}$ output by the current stabilizer circuit 110.

After $I_{cell}$ is stabilized, the control module 108 generates a control signal that turns off switch 118. After the voltage at node N2 ($V_{N2}$) stabilizes (i.e. reaches a steady-state value), the control module 108 generates another control signal that turns off switch 122. The resultant circuit is shown in FIG. 4F. When switch 122 is turned off, transistor $T_7$ operates as a capacitance (identified as equivalent capacitance $C_{T7}$ in FIGS. 4D and 4E) and stores $V_{GS}$. This completes a sample-and-hold operation for $I_{cell}$.

Thereafter, the control module 108 generates control signals that turn off transistor $T_1$ and turn on transistor $T_2$. Consequently, current $I_{cell}$ is deselected and is not input to node N1. Instead, current $I_{ref}$ is selected and input to node N1. Current $I_{ref}$ is sensed and stabilized in the same manner as current $I_{cell}$ is sensed and stabilized.

When $I_{ref} > I_{cell}$, node N2 is pulled down (i.e., $V_{N2}$ goes low). Conversely, when $I_{ref} < I_{cell}$, node N2 is pulled up (i.e., $V_{N2}$ goes high). The change in $V_{N2}$ is input to the buffer 109. The buffer 109 may generate an output having one state (for example only, binary 0) when $V_{N2}$ switches from high to low voltage level. Conversely, the buffer 109 may generate an output having another state (for example only, binary 1) when $V_{N2}$ switches from low to high voltage level. Accordingly, depending on the change in $V_{N2}$, the output of the buffer 109 may indicate the state of the selected memory cell.

Referring now to FIGS. 5A and 5B, additional implementations of the sensing amplifier are shown. In FIG. 5A, a sensing amplifier 130 includes a current sensing stage 106-1, wherein a unity gain buffer 132 is added between node N2 and switch 122. The unity gain buffer 132 isolates the capacitance of transistor $T_7$. The isolation decreases a settling time of $V_{N2}$. In FIG. 5B, a sensing amplifier 140 includes a current sensing stage 106-2, wherein a sensing circuit 114-1 includes a voltage-controlled current source (VCCS) instead of transistors $T_5$ and $T_6$.

In FIGS. 4A-5B, the positive and negative MOS (i.e., PMOS and NMOS) transistors may be interchanged. When the transistors are interchanged, the polarities and states of voltages and signals may be reversed.

In some implementations, $I_{ref}$ (or $I_{cell}$) may be converted from an analog to a digital value using an analog-to-digital converter (ADC). The digital value may be stored in a latch. Subsequently, $I_{ref}$ (or $I_{cell}$) may be regenerated by inputting the digital value to a digital-to-analog converter (DAC). The regenerated $I_{ref}$ (or $I_{cell}$) may then be compared to $I_{cell}$ (or $I_{ref}$) to determine whether $I_{ref} > I_{cell}$ or $I_{ref} < I_{cell}$. Accordingly, the state of the selected memory cell can be determined. In addition, $I_{cell}$ (or $I_{ref}$) may be represented as stored voltage.

Referring now to FIGS. 6A and 6B, flowcharts of methods for sensing states of memory cells using the sensing amplifier 100 are shown. In FIG. 6A, a method 200 for sensing the state of the selected memory cell using the sensing amplifier 100 begins at step 202. The current selection stage 102 selects and sources $I_{cell}$ into the input stage 104 in step 204. The current stabilizer circuit 110 stabilizes $I_{cell}$ in step 206. In step 208, the sample-and-hold circuit 116 samples $I_{cell}$ and stores the value of $I_{cell}$ in transistor $T_7$, which operates as a capacitance. In other words, $I_{cell}$ can be stored as a first value such as a voltage value across the capacitance.

The current selection stage 102 deselects $I_{cell}$ in step 210. The current selection stage 102 selects and sources $I_{ref}$ into the input stage 104 in step 212. The current stabilizer circuit 110 stabilizes $I_{ref}$ in step 214. The currents $I_{ref}$ and $I_{cell}$ may be stored as voltages as described herein. The current sensing stage 106 compares a second value based on $I_{ref}$ to the first value based on $I_{cell}$ in step 216. In step 218, the buffer 109 indicates the state of the selected memory cell based on the result of the comparison. The method 200 ends in step 220.

In FIG. 6B, a method 250 for sensing the state of the selected memory cell using the sensing amplifier 100 begins at step 252. In step 254, the control module 108 turns on transistor $T_1$ and turns off transistor $T_2$ of the current selection stage 102 to select and source $I_{cell}$ into the input stage 104. In step 256, the control module 108 turns on switch 122 of the sample-and-hold circuit to operate the current sensing PMOS transistors $T_5$ and $T_6$ in diode configuration. In step 258, the control module 108 turns on switch 118 of the current stabilizer circuit 110, wherein the auxiliary pull-up transistor $T_3$ pulls up node N2 thereby operating the input transistor $T_4$ in saturation mode and stabilizing current $I_{cell}$.

In step 260, the control module 108 turns off switch 118 after $I_{cell}$ stabilizes and subsequently turns off switch 122 after $V_{N2}$ stabilizes. In step 262, the sample-and-hold circuit 116 stores the gate voltage $V_{GS}$ of the current sensing PMOS transistors $T_5$ and $T_6$ in transistor $T_7$, wherein $V_{GS}$ represents the value of $I_{cell}$. In step 264, the control module 108 turns off transistor $T_1$ to deselect $I_{cell}$ and turns on transistor $T_2$ to select and source $I_{ref}$ into the input stage 104. In step 266, steps 256 through 260 are repeated for $I_{ref}$.

In step 268, whether $I_{ref} > I_{cell}$ or $I_{ref} < I_{cell}$ is determined. As described herein, this comparison may be made based on first and second values that are, in turn, based on $I_{ref}$ and $I_{cell}$.

When $I_{ref} > I_{cell}$, node N2 is pulled down, $V_{N2}$ changes from the high voltage level to the low voltage level, and buffer 109 indicates that the state of the selected memory cell is the first state in step 270. On the other hand, when $I_{ref} < I_{cell}$, node N2 is pulled up, $V_{N2}$ changes from the low voltage level to the high voltage level, and buffer 109 indicates that the state of the selected memory cell is the second state in step 274. Following step 270 or 274, the method 250 ends in step 272.

Referring now to FIGS. 7A and 7B, the teachings of the present disclosure can be extended to storage products including data storage systems and solid-state drives (SSDs). SSDs are data storage devices that use solid-state memory (e.g., flash memory) to store data. The architecture and the configuration of the data storage system shown in FIGS. 7A and 7B are exemplary. Other architectures and configurations are contemplated.

In FIG. 7A, for example only, a data storage system 280 may comprise a storage area network (SAN) control module 282, a SAN switching unit 284, and storage units 286-1, 286-2, . . . , and 286-n (collectively storage units 286), where n is an integer greater than 1. The SAN control module 282 may comprise a control unit that interfaces the data storage system 280 to one or more external devices (not shown) through an input/output (I/O) bus 288. For example, the control unit may include a processor, a microprocessor, an ASIC, a state machine, etc. For example, the external devices may include a host, a server, etc. The I/O bus 288 may comprise a bus that provides high speed and wide bandwidth for data transmission. For example, the I/O bus 288 may include fiber-channels, Ethernet, etc. For example only, the transmission speed of the I/O bus 288 may be faster than 10 gigabits per second (10 Gb/s).

Additionally, the SAN control module 282 may control the SAN switching unit 284. For example only, the SAN switching unit 284 may include a plurality of switches. Each of the switches may interface with one of the storage units 286 and may be controlled by the SAN control module 282. The storage units 286 may store information that includes audio data, video data, and/or any other types of data in a digital format.

In FIG. 7B, for example only, one of the storage units 286 (e.g., the storage unit 286-n) may comprise a storage unit control module 290, solid-state drives (SSDs) 292-1, . . . , and 292-n (collectively SSDs 292), a startup storage unit 294, and a bus 296, where n is an integer greater than 1. Each of the SSDs 292 may comprise one or more memory IC 298. For example only, the SSD 292-1 may comprise memory ICs $298_{11}, \ldots, 298_{1i}, 298_{1j}, \ldots$, and $298_{1m}$, where m is an integer greater than 1. Each memory IC 298 may utilize the sensing amplifier 100, 130, or 140 for sensing states of memory cells of the memory IC 298. Additionally, each of the SSDs 292 may comprise a memory controller (not shown) that controls the one or more of the memory IC 298. The startup storage unit 294 may include code for operating the storage unit control module 290. Using the code, the storage unit control module 290 may control the SSDs 292 via the bus 296.

Figure 8A:
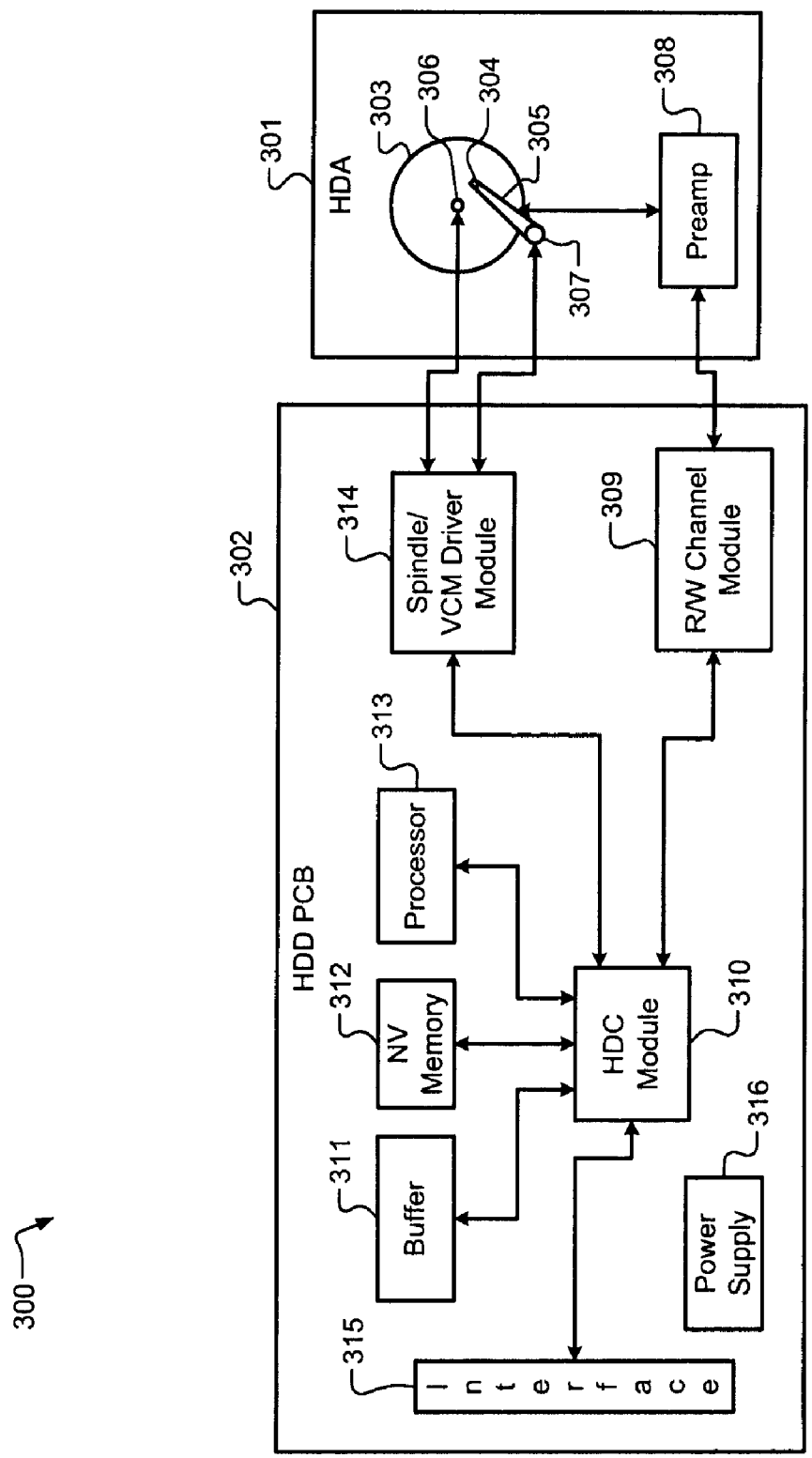
FIG. 8A is a functional block diagram of a hard disk drive.

Referring now to FIGS. 8A-8E, various exemplary implementations incorporating the teachings of the present disclosure are shown. In FIG. 8A, the teachings of the disclosure can be implemented in a buffer 311 and/or nonvolatile memory 312 of a hard disk drive (HDD) 300. The HDD 300 includes a hard disk assembly (HDA) 301 and an HDD printed circuit board (PCB) 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, the buffer 311, nonvolatile memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. Nonvolatile memory 312 may include any suitable type of semiconductor or solid-state memory, such as flash memory (including NAND and NOR flash memory), phase change memory, magnetic RAM, and multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 8B:
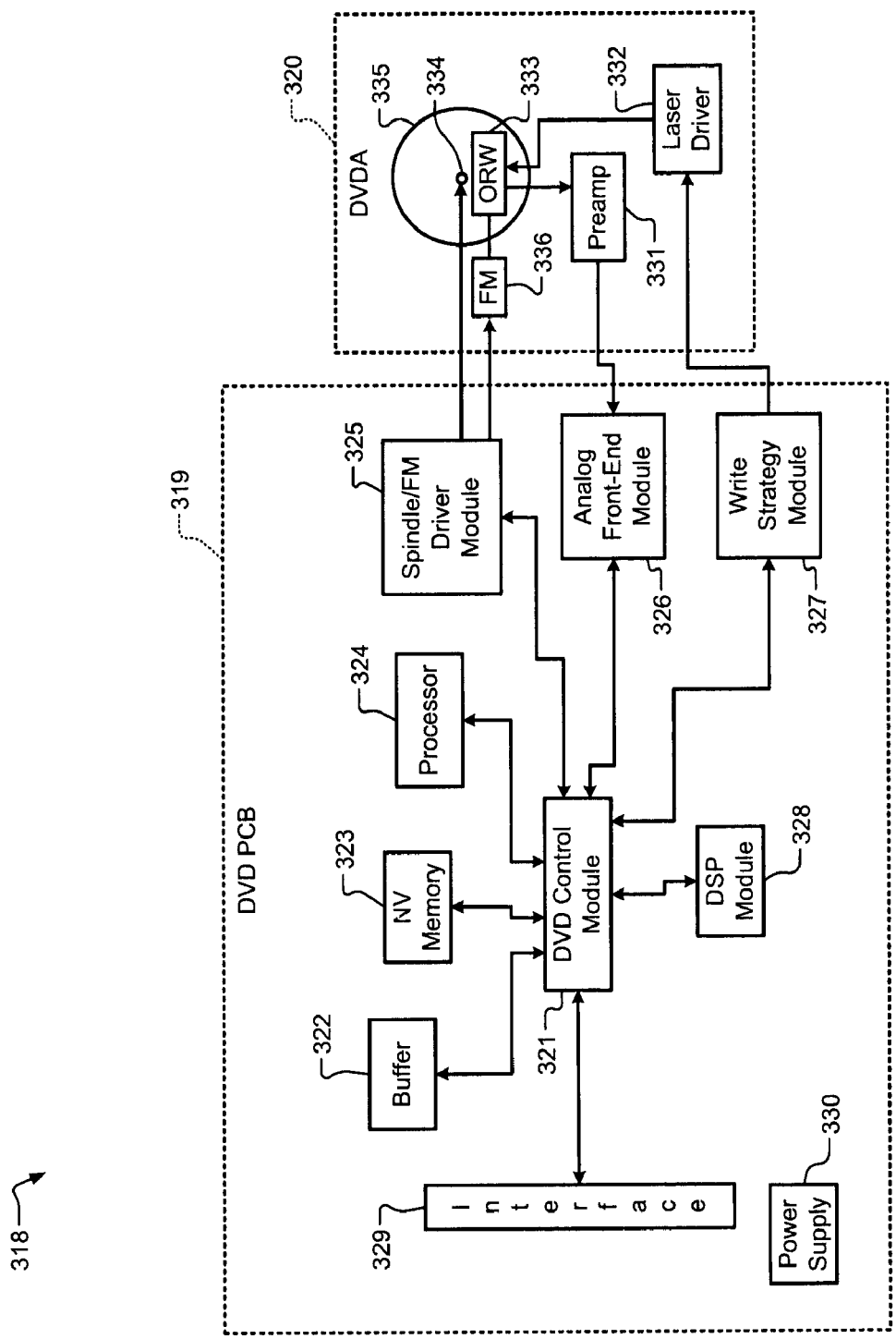
FIG. 8B is a functional block diagram of a DVD drive.

In FIG. 8B, the teachings of the disclosure can be implemented in a buffer 322 and/or nonvolatile memory 323 of a DVD drive 318 or of a CD drive (not shown). The DVD drive 318 includes a DVD PCB 319 and a DVD assembly (DVDA) 320. The DVD PCB 319 includes a DVD control module 321, the buffer 322, nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. Nonvolatile memory 323 may include any suitable type of semiconductor or solid-state memory, such as flash memory (including NAND and NOR flash memory), phase change memory, magnetic RAM, and multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 8D:
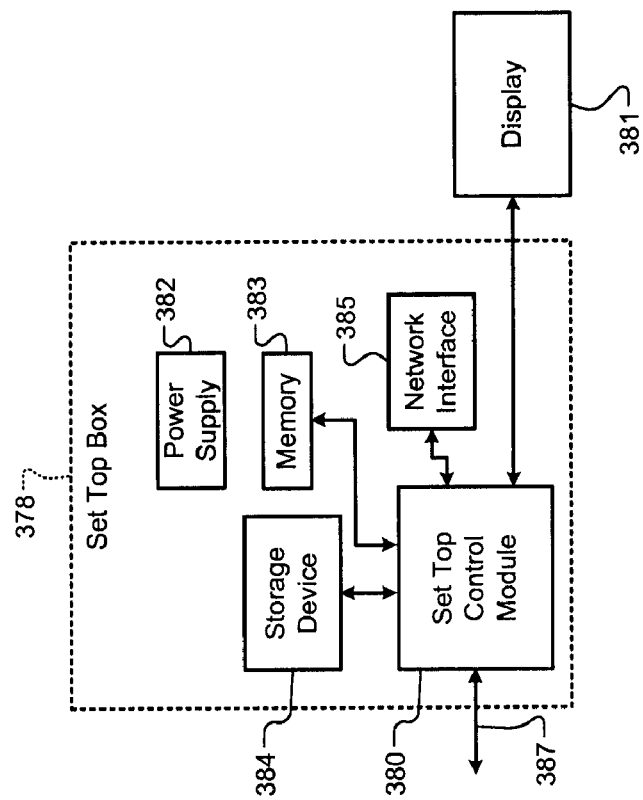
FIG. 8D is a functional block diagram of a set top box.
Figure 8C:
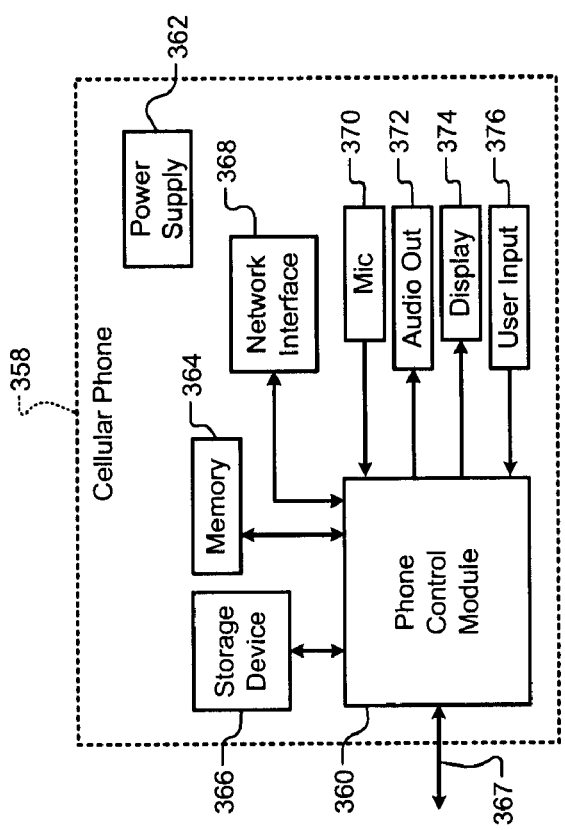
FIG. 8C is a functional block diagram of a cellular phone.

In FIG. 8C, the teachings of the disclosure can be implemented in memory 364 of a cellular phone 358. The cellular phone 358 includes a phone control module 360, a power supply 362, memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 366 may include an optical storage drive, such as a DVD drive, and/or a hard disk drive (HDD). The power supply 362 provides power to the components of the cellular phone 358.

In FIG. 8D, the teachings of the disclosure can be implemented in memory 383 of a set top box 378. The set top box 378 includes a set top control module 380, a display 381, a power supply 382, memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/ or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 384 may include an optical storage drive, such as a DVD drive, and/or a hard disk drive (HDD).

Figure 8E:
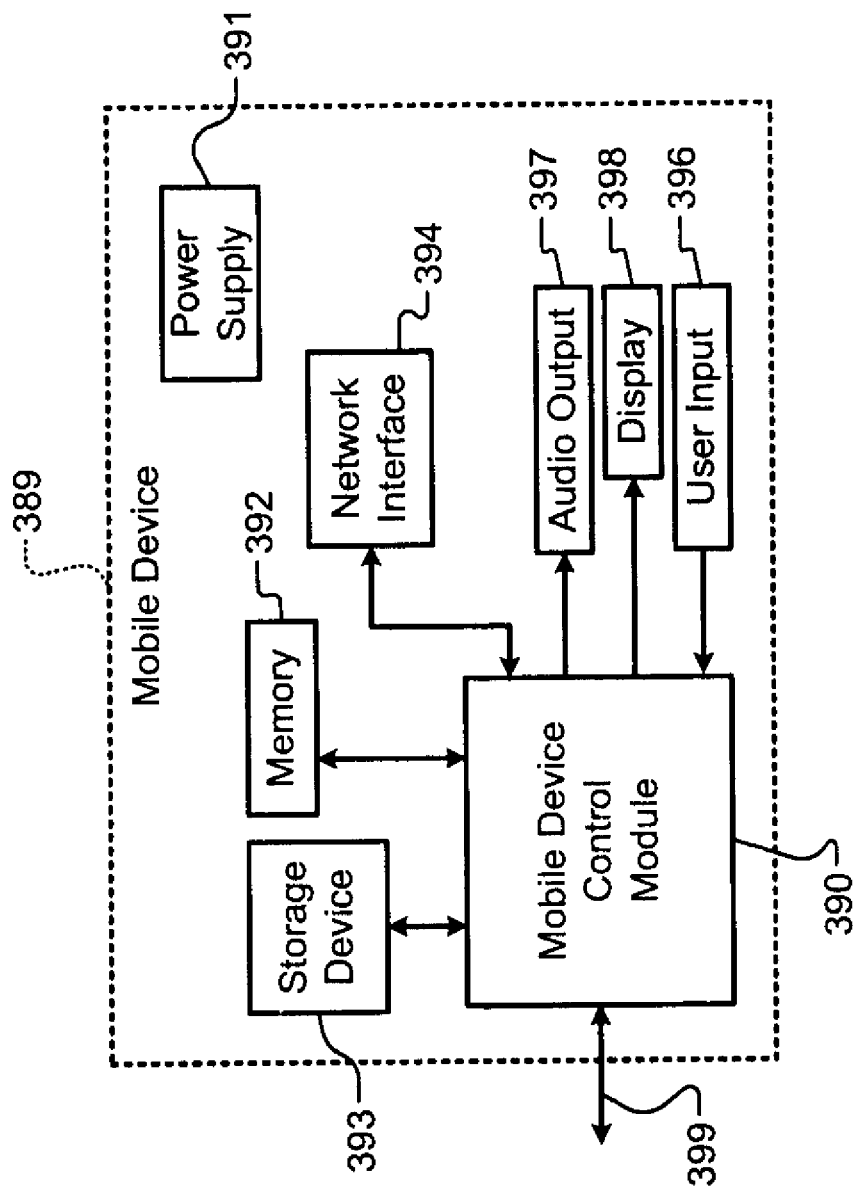
FIG. 8E is a functional block diagram of a mobile device.

In FIG. 8E, the teachings of the disclosure can be implemented in memory 392 of a mobile device 389. The mobile device 389 may include a mobile device control module 390, a power supply 391, memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A sensing amplifier for a memory cell, comprising:
   a selection stage that outputs one of a reference current and a memory cell current during a first period and the other of the reference current and the memory cell current during a second period, wherein the first period and the second period are non-overlapping;
   an input stage that generates a first current based on the one of the reference current and the memory cell current during the first period and that generates a second current based on the other of the reference current and the memory cell current during the second period; and
   a sensing stage that senses a first value based on the first current and stores the first value during the first period, that senses a second value based on the second current during the second period and that compares the first value to the second value without storing the second value.

2. The sensing amplifier of claim 1 wherein the second period occurs after the first period.

3. The sensing amplifier of claim 1 wherein the sensing stage outputs a state selection signal that selects a state of the memory cell based on the comparison.

4. The sensing amplifier of claim 1 further comprising a control module that generates control signals defining the first and second periods.

5. The sensing amplifier of claim 1 wherein the input stage comprises:
   an input transistor having a first terminal that communicates with the selection stage and a second terminal that communicates with the sensing stage; and
   a current stabilizing circuit that selectively pulls a voltage of the second terminal up to operate the input transistor in saturation mode.

6. The sensing amplifier of claim 5 wherein the current stabilizing circuit includes a pull-up transistor including a first terminal that communicates with the second terminal of the input transistor.

7. The sensing amplifier of claim 5 wherein the input stage further comprises a gain booster circuit that increases gain and decreases an input impedance of the input transistor.

8. The sensing amplifier of claim 7 wherein:
   the input transistor has a first transconductance and includes a control terminal; and
   the gain booster circuit includes an amplifier having a gain, an input that communicates with the first terminal of the input transistor, and an output that communicates with the control terminal of the input transistor.

9. The sensing amplifier of claim 8 wherein the amplifier decreases the input impedance based on an inverse of a product of the gain and the first transconductance.

10. The sensing amplifier of claim 1 wherein the sensing stage comprises:
    a sensing circuit that senses the first and second values; and
    a sample-and-hold circuit that samples and holds the first value.

11. The sensing amplifier of claim 10 wherein the sensing circuit includes first and second transistors that selectively operate in a diode configuration when the second terminal is pulled-up.

12. The sensing amplifier of claim 11 wherein control terminals of the first and second transistors communicate with each other, and wherein the sample-and-hold circuit includes:
    a third transistor having a control terminal that communicates with the control terminals of the first and second transistors; and
    a switch that selectively connects the control terminal of the third transistor to the second terminal of the input transistor.

13. The sensing amplifier of claim 12 wherein the switch selectively connects the control terminal of the third transistor to the second terminal of the input transistor.

14. The sensing amplifier of claim 10 wherein the sensing circuit includes a voltage controlled current source (VCCS).

15. The sensing amplifier of claim 12 further comprising a buffer that connects the switch to the second terminal and that isolates the third transistor from the second terminal of the input transistor.

16. The sensing amplifier of claim 5 wherein the second terminal has a first voltage when the second value is greater than the first value and a second voltage when the second value is less than the first value, where the first voltage is different than the second voltage.

17. The sensing amplifier of claim 16 further comprising a buffer that outputs a first binary state after voltage at the second terminal switches from the first voltage to the second voltage and that outputs a second binary state after the voltage at the second terminal switches from the second voltage to the first voltage.

18. The sensing amplifier of claim 17 wherein the buffer includes one of an inverter and a voltage amplifier.

19. An integrated circuit comprising the sensing amplifier of claim 1 and further comprising a decoder.

20. The integrated circuit of claim 19 further comprising a memory array comprising a plurality of memory cells, wherein the decoder selects the memory cell from the plurality of memory cells.

21. A solid-state drive (SSD) comprising the integrated circuit of claim 20.

22. A data storage system comprising a storage area network (SAN) control module that controls a plurality of storage units each comprising a plurality of the SSD of claim 21.

23. A method for operating a sensing amplifier for a memory cell, comprising:
- selecting one of a reference current and a memory cell current during a first period;
- selecting the other of the reference current and the memory cell current during a second period, wherein the first period and the second period are non-overlapping;
- generating a first current based on the one of the reference current and the memory cell current during the first period;
- generating a second current based on the other of the reference current and the memory cell current during the second period;
- sensing a first value based on the first current and storing the first value during the first period;
- sensing a second value based on the second current during the second period; and
- comparing the first value to the second value without storing the second value.

24. The method of claim 23 wherein the second period occurs after the first period.

25. The method of claim 23 further comprising generating a state selection signal to select a state of the memory cell based on the comparison.

26. The method of claim 23 further comprising generating control signals defining the first and second periods.

27. The method of claim 23 further comprising:
- providing an input transistor having a first terminal that communicates with a selection stage and a second terminal that communicates with a sensing stage; and
- selectively pulling a voltage of the second terminal up to operate the input transistor in saturation mode.

28. The method of claim 27 further comprising providing a pull-up transistor including a first terminal that communicates with the second terminal of the input transistor.

29. The method of claim 27 further comprising providing a gain booster circuit that increases gain and decreases an input impedance of the input transistor.

30. The method of claim 29 wherein the input transistor has a first transconductance and includes a control terminal, and wherein the gain booster circuit includes an amplifier having a gain, an input that communicates with the first terminal of the input transistor, and an output that communicates with the control terminal of the input transistor.

31. The method of claim 30 wherein the amplifier decreases the input impedance based on an inverse of a product of the gain and the first transconductance.

32. The method of claim 27 further comprising:
- sensing the first and second values; and
- sampling and holding the first value.

33. The method of claim 32 further comprising selectively operating first and second transistors in a diode configuration when the second terminal is pulled-up.

34. The method of claim 27 wherein the second terminal has a first voltage when the second value is greater than the first value and a second voltage when the second value is less than the first value, where the first voltage is different than the second voltage.

35. The method of claim 34 further comprising providing a buffered output at a first binary state after voltage at the second terminal switches from the first voltage to the second voltage and at a second binary state after the voltage at the second terminal switches from the second voltage to the first voltage.

* * * * *